United States Patent [19]

Hu et al.

[11] Patent Number: 5,768,182

[45] Date of Patent: Jun. 16, 1998

[54] FERROELECTRIC NONVOLATILE DYNAMIC RANDOM ACCESS MEMORY DEVICE

[75] Inventors: Chenming Hu, Alamo; Reza Moazzami, Oakland, both of Calif.

[73] Assignee: The Regents of the University of California, Oakland, Calif.

[21] Appl. No.: 437,537

[22] Filed: May 9, 1995

Related U.S. Application Data

[63] Continuation of Ser. No. 167,445, Dec. 14, 1993, abandoned, which is a continuation of Ser. No. 704,580, May 21, 1991, abandoned.

[51] Int. Cl.$^6$ .................... H01L 31/062; H01L 31/113
[52] U.S. Cl. .................... 365/145; 257/295; 257/296; 257/310; 365/149
[58] Field of Search .................... 357/23.6; 365/145, 365/149; 257/295, 310, 296

[56] References Cited

U.S. PATENT DOCUMENTS

| | | | |
|---|---|---|---|
| 4,873,664 | 10/1989 | Eaton, Jr. ........................ | 365/145 |
| 4,914,627 | 4/1990 | Eaton, Jr. et al. ................ | 365/145 |
| 5,010,518 | 4/1991 | Toda .............................. | 365/145 |
| 5,081,559 | 1/1992 | Fazan et al. .................... | 357/23.6 |
| 5,109,357 | 4/1992 | Eaton, Jr. ........................ | 365/145 |
| 5,136,534 | 8/1992 | McDavid et al. ................ | 357/23.6 |
| 5,297,077 | 3/1994 | Imai et al. ...................... | 365/117 |
| 5,517,445 | 5/1996 | Imai et al. ...................... | 365/145 |

FOREIGN PATENT DOCUMENTS

| | | | |
|---|---|---|---|
| 3-5996 | 1/1991 | Japan .............................. | 365/145 |

OTHER PUBLICATIONS

D. Bondurant, et al., "Ferroelectrics for Nonvolatile RAMs," IEEE Spectrum (Jul. 1989), pp. 30–31.

J. T. Evans, et al., "An Experimental 512-bit Nonvolatile Memory with Ferroelectric Storage Cell," IEEE Journal of Solid–State Circuits (Oct. 1988), 23(5):1171–1175.

R. Freeman, "User-programmable Gate Arrays", IEEE Spectrum (Dec. 1988), pp. 32–35.

G. Yi, et al., "Preparation of Pb(Zr,Ti)O3 Thin Films by Sol Gel Processing: Electrical, Optical, and Electro-Optic Properties," J. Appl. Phys. (Sep. 1988) 64(5):2717–2724.

R. Moazzami, et al., "A Ferroelectric DRAM Cell for High Density NVRAMs," IEEE 1990 Symposium on VLSI Technology, pp. 15–16.

Primary Examiner—Ngân V. Ngô
Attorney, Agent, or Firm—Townsend and Townsend and Crew LLP

[57] ABSTRACT

A dynamic random access memory cell is described which can operate either in volatile or nonvolatile mode. When operating in a volatile mode, the memory cell operates in the same manner as a conventional dynamic random access memory cell, that is, with charge being stored and discharged from a capacitor in the memory cell. Upon receipt of a suitable signal, however, the cell can be switched to a nonvolatile mode of operation. In this mode of operation, a pulse applied to the capacitor can place a ferroelectric film in the desired polarization state to represent the binary data. The ferroelectric film will hold its polarization state until the data is recalled and the cell reverts to operating in a volatile mode.

21 Claims, 7 Drawing Sheets

FERROELECTRIC NONVOLATILE DYNAMIC RANDOM ACCESS MEMORY DEVICE

This is a continuation of application Ser. No. 08/167,445, filed Dec. 14, 1993, now abandoned, which is a continuation of application Ser. No. 07/704,580, filed May 21, 1991, now abandoned.

This invention was made with Government support under Contract No. AF49620-87-C-0041, awarded by the United States Air Force. The Government has certain rights in this invention.

BACKGROUND OF THE INVENTION

Numerous types of integrated circuit devices are now well known which are capable of storing information. Of these, dynamic random access memory (DRAM) is the semiconductor product with the largest market. In a conventional DRAM, as shown in FIG. 1, each memory cell consists of a transistor and a capacitor connected to a bit line and a word line. The binary information "1" and "0" are represented by the presence and absence of capacitor charge. To write 0 or 1 into the DRAM cell, the transistor is turned on briefly by the word line while the bit line is held at ground potential to write a "0," or held at $V_{cc}$, e.g., 5 volts, to write a "1". Of course, the interpretation of the presence or absence of charge is according to convention, and the same charge states can be interpreted oppositely. To read the stored data, the potential of the bit line is stabilized, and the transistor is turned on. The stored capacitor charge, if it is present, raises the bit-line potential slightly, enabling a sense amplifier to determine the state of the cell. Because reading the cell dissipates any stored charge, the "1" and "0" data is written back ("refreshed") into the memory cell each time the cell is read. Thus, DRAM is a volatile memory, in other words, the memory content (the capacitor charge) is lost unless an electric power source is available continuously.

The commercial success of DRAM results from the compactness of the memory cell, which makes high storage density and low cost possible. With present integrated circuit fabrication technology, millions of bits can be stored in a square centimeter and sold for a few dollars. Unfortunately, it has become increasingly more difficult to reduce cell size to increase the memory density. To achieve sufficient signal-to-noise ratio, the capacitor must have sufficiently large capacitance to effect the potential of a bit line coupled to hundreds or thousands of other cells. The high capacitance can be achieved by the use of very thin capacitor dielectrics, but dielectric breakdown reliability limits this approach. Alternatively, the capacitor area can be enlarged through the use of deep trenches or stacked capacitor plates, but at the expense of high development and manufacturing costs.

Recently, some companies have reported investigations of a class of materials known as ferroelectrics for use as the DRAM capacitor dielectric. These materials can be polarized by an electric field, and include for example, lead zirconate titanate ($PbZr_xTi_{1-x}O_3$), herein PZT, or other materials such as barium titanate ($BaTiO_3$). These ferroelectric films have very high electric permittivity, enabling a 4000 Å thick ferroelectric film, with essentially no breakdown reliability problems, to yield the same capacitance as 20 Å thick silicon dioxide. This is a potentially attractive approach to making future-generation DRAMs. This technique is referred to as the volatile ferroelectric DRAM. In this cell, the ferroelectric film functions only as a high-permittivity dielectric.

Volatile ferroelectric DRAM technology can be modified to fabricate a nonvolatile ferroelectric memory. Such nonvolatile ferroelectric memories have recently been introduced as commercial products by National Semiconductor. The nonvolatile ferroelectric memory uses an unusual property of the ferroelectric material, which the volatile ferroelectric DRAM does not use. A ferroelectric film can maintain a permanent polarization normal to the film in either polarity (direction), and the polarization can be switched from one polarity to the other through the application of an electric pulse of suitable amplitude on the order of 5 volts. An electrical pulse of the opposite polarity is required to switch the polarization again. A description of such a memory appears in "Ferroelectrics for Nonvolatile RAMs" by David Bondurant and Fred Gnadinger, *IEEE Spectrum* (July, 1989), pp. 30–33.

In such cells the capacitor dielectric is a ferroelectric film as shown schematically in FIG. 2. The state of the cell, "1" and "0," is represented by the polarity of the permanent polarization. When reading the cell, an external circuit applies an electrical pulse of suitable magnitude, for example, 5 volts, and fixed polarity to one plate of the capacitor. Depending on the polarity of the permanent polarization "stored" in the ferroelectric film, the polarization polarity will or will not switch. If the polarization polarity switches, a large capacitive current pulse will flow to the bit line and raise the bit line potential. This potential rise is sensed by a sensitive circuit, thereby determining the cell's content. The capacitive current pulse and the bit line potential rise is much lower when the polarization polarity is not switched. After each read, the data is written back to the memory cell by other circuitry. Because the data is rewritten, a memory cell either undergoes zero or two polarization reversals during each read. On the average, the polarization is switched once every read operation.

The nonvolatile ferroelectric memory cell is not only potentially as small as a DRAM cell, but it also retains the stored data in the absence of electric power (nonvolatility). This has inspired some people to call it the "ideal memory." Unfortunately, the ideal memory is not ideal, at least not yet. After a ferroelectric film has undergone a large number of polarization reversals, the ferroelectric film gradually loses its desirable characteristics, notably the large magnitude of the permanent polarization and the ability to retain the "permanent" polarization. Loss of the permanency and magnitude of the polarization destroys the ability of the cell to store the data reliably. This phenomenon, known as fatigue, limits read (or write) cycles of the nonvolatile ferroelectric memory at about $10^{12}$ cycles. Unfortunately, this limit is unacceptable for general applications, because $10^{12}$ cycles can be used in only $10^5$ seconds (28 hours) when a memory cell is read at 10 MHz ($10^7$ times per second). Ten years is widely acknowledged as the minimum required lifetime for general purpose nonvolatile memory.

SUMMARY OF THE INVENTION

This invention provides a random access memory with a single transistor cell. The cell can be operated as a conventional dynamic random access memory, but upon detection of power loss, or receipt of a command, also can be caused to store information in a nonvolatile manner.

In a preferred embodiment, the cell includes a capacitor which has a first plate, a second plate, and a ferroelectric dielectric layer between the two plates which is switchable between two states. A transistor is connected to one terminal of the capacitor and to a bit line and a word line. The other terminal of the capacitor is connected to a drive line, that is, a source of electrical signals capable of applying pulses to the capacitor plate to switch the state of the ferroelectric layer when desired. The method of operating the memory cell consists of operating the cell in a first mode to write information into and read information from the cell dynamically, and then, upon receipt of a control signal, switching the operation of the cell to a nonvolatile mode in which the state of the cell is stored nonvolatilely by applying an appropriate polarity pulse to the capacitor dielectric. The state of the memory cell can be recalled subsequently upon command.

DESCRIPTION OF THE SPECIFIC EMBODIMENTS

This invention circumvents the fatigue problem of prior art ferroelectric DRAM cells while retaining all the desirable characteristics of the "ideal" memory. In particular, the invention provides a nonvolatile memory with a very compact cell size, which is scalable with improvements in technology. No high voltage (>5 volts) is needed on or off chip, yet the cell has very fast read and write operation, and practically no fatigue limit on the number of read and write cycles.

Figure 3:
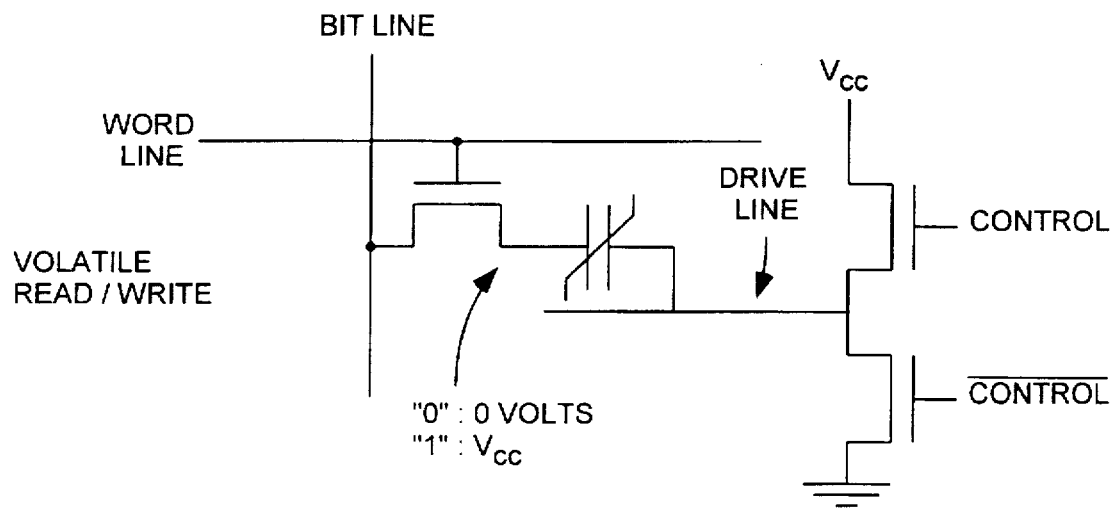
FIG. 3 is a schematic diagram of a memory cell during read/write according to a preferred embodiment of this invention.

A preferred embodiment of our memory cell is shown in FIG. 3. This cell is constructed and normally operated during both read and write as a volatile ferroelectric DRAM. In other words in normal read and write operations, the memory functions as a conventional DRAM with a ferroelectric film serving only as a high permittivity dielectric. The "0" and "1" states correspond to 0V and $V_{cc}$, respectively, on the capacitor terminal as shown in FIG. 3.

Figure 1:
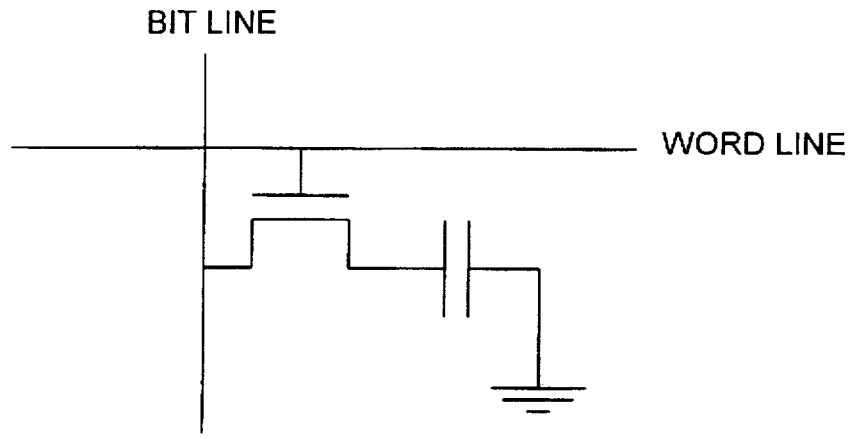
FIG. 1 is a schematic diagram of a single transistor prior art DRAM cell during read/write.

Because the voltage applied across the ferroelectric film during read and write is always of one and the same polarity (the drive line is fixed at $V_{cc}$ during read and write), the polarity of the ferroelectric film polarization is not reversed. Therefore, the fatigue phenomenon described earlier does not affect this memory device. Unlike prior art DRAM devices, however, the drive line is selectively connected to a potential source, $V_{cc}$, or ground as shown in FIG. 3. (In the prior art memory cells, the drive line is connected to a fixed potential, for example, ground as shown in FIG. 1 or $V_{cc}$ or $V_{cc}/2$.) For the embodiment shown in FIG. 3, connecting the capacitor to $V_{cc}$ has no effect on the normal volatile read and write operation of the cell, but is significant for reasons explained below. Also, in contrast to the nonvolatile memory shown in FIG. 2, the drive line of the cell of the preferred embodiment need not be pulsed during read or write operation, which results in faster memory read and write operation.

Figure 4:
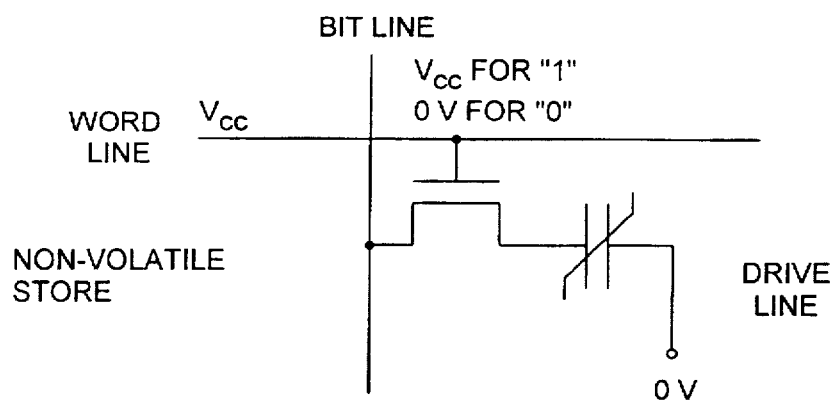
FIG. 4 is a schematic diagram of a memory cell during nonvolatile store according to a preferred embodiment of this invention.

The cell of this invention, however, in contrast to prior art DRAM cells, can be switched to a nonvolatile mode. To achieve this, the data in the cell is first read in the normal manner and then stored back into the cell in a nonvolatile manner by polarizing the ferroelectric film in one or the other polarity. FIG. 4 shows that, for example, a "0," represented by 0V stored on the capacitor plate connected to the transistor, may be stored in the cell by grounding the drive line and bit line and turning on the transistor. If desired, because the drive line is held at $V_{cc}$ during read and write operation, this store "0" operation can be omitted because the ferroelectric film is already polarized in the "0" polarity. A "1" can be stored by grounding the drive line, setting the bit line to $V_{cc}$, and turning on the transistor, thus poling the ferroelectric film in the opposite polarity as shown in FIG. 4. This process is repeated for each row in a memory array (i.e., each word line). In this embodiment, when the drive-line potential is lowered to 0V for the store operation, some charge present on capacitors containing volatile data may leak into the substrate. This potential loss of data can be prevented by applying $-V_{cc}$ to the substrate.

Figure 2:
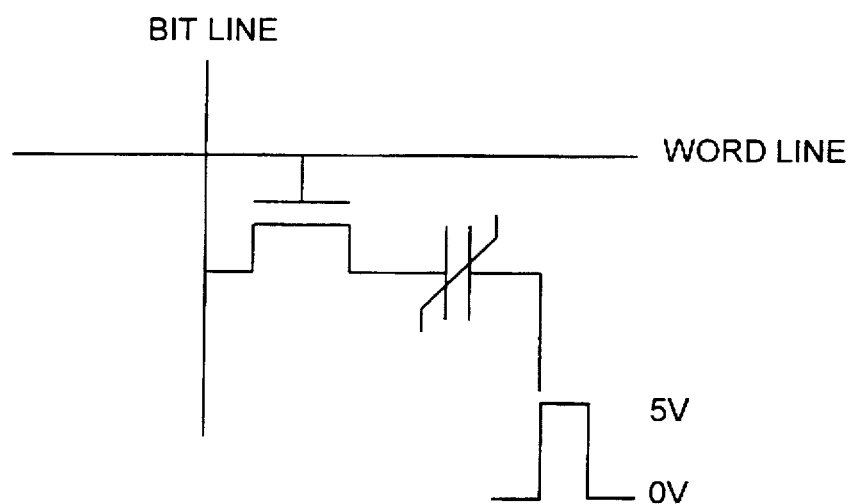
FIG. 2 is a schematic diagram of a single transistor prior art nonvolatile DRAM cell during read/write.
Figure 5:
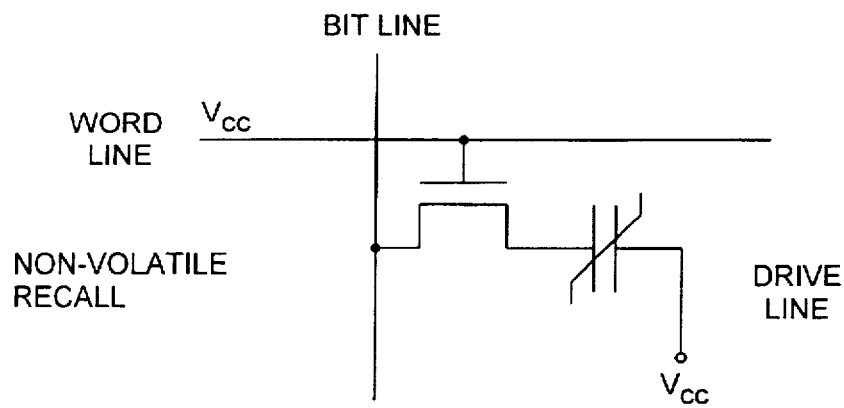
FIG. 5 is a schematic diagram of a memory cell during nonvolatile recall according to a preferred embodiment of this invention.

The recall operation is similar to the read operation of the nonvolatile ferroelectric memory described in FIG. 2. In the present invention, however, as shown in FIG. 5, the drive line is raised to and fixed at $V_{cc}$ upon command, rather than repeatedly pulsed between $V_{cc}$ and 0V. The recall operation is accomplished by precharging the bit line to a low potential, such as $V_{cc}/2$ or 0V, and then turning on the transistor. Only after the transistor is turned on will the ferroelectric film be subjected to the potential difference between the drive line and bit line. If polarization reversal occurs, a large capacitive current pulse will flow to the bit line and change the bit-line potential. A sense amplifier circuit recognizes the potential difference between this case and the case where polarization reversal does not occur. The data is subsequently written into the cell as the appropriate volatile DRAM state by setting the bit line to the appropriate voltage (0V for "0" and $V_{cc}$ for "1") while the transistor is on. Afterwards, the memory cell operates as a volatile ferroelectric DRAM until the next nonvolatile store operation.

In another embodiment of this invention, the drive line is grounded during read and write operation. In this case, for the store operation, the drive line is raised to $V_{cc}$, the bit line is either grounded (for a "0") or set to $V_{cc}$ (for a "1"), and the transistor is turned on. This operation is repeated for each row of memory cells, i.e., each word line. The recall operation is performed as described above for the preferred embodiment. Once the nonvolatile state of the cell is sensed, the drive line is grounded again and the appropriate volatile DRAM state written into the cell.

Figure 6:
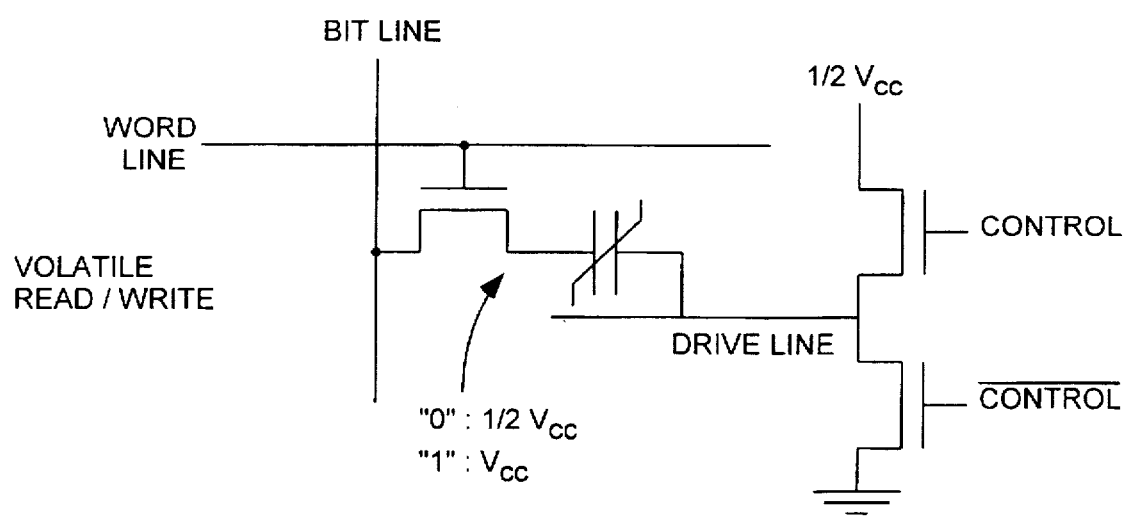
FIG. 6 is a schematic diagram of a memory cell during read/write according to another embodiment of this invention.
Figure 7:
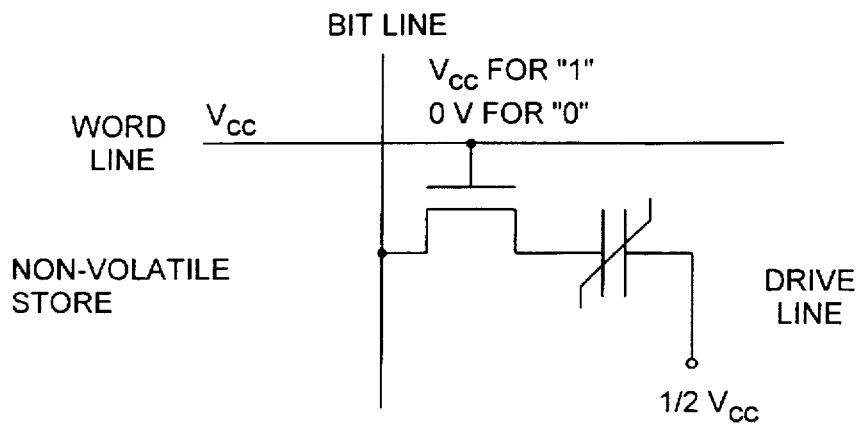
FIG. 7 is a schematic diagram of a memory cell during nonvolatile store according to another embodiment of this invention.
Figure 8:
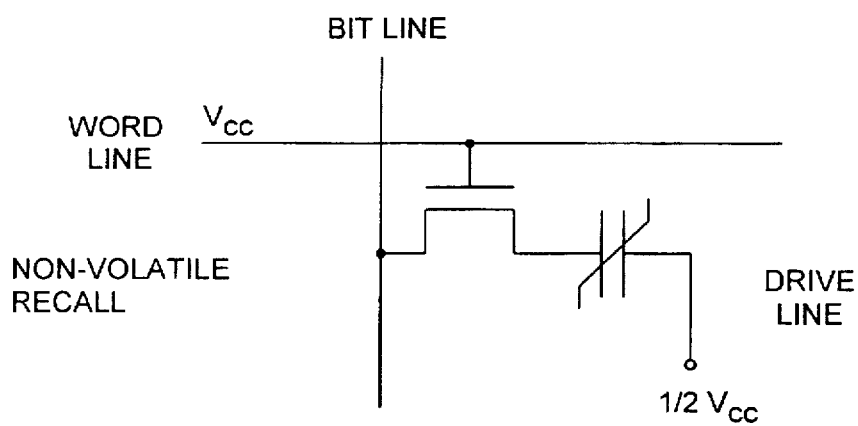
FIG. 8 is a schematic diagram of a memory cell during nonvolatile recall according to another embodiment of this invention.

In a third embodiment of this invention shown in FIG. 6, the drive line is held at $V_{cc}/2$ during DRAM read and write operation. The "0" and "1" states correspond to $V_{cc}/2$ and $V_{cc}$, respectively, on the capacitor terminal. It is also possible to operate the memory using 0V to represent "0" and $V_{cc}/2$ to represent "1" without affecting the store and recall operations described below. As in the previous embodiments, because the voltage applied across the ferroelectric film is always of one and the same polarity during read and write, the fatigue problem described above does not occur. The store operation for this embodiment is demonstrated in FIG. 7. For example, once the volatile data is read, nonvolatile "0" is stored by grounding the bit line and turning on the transistor. Similarly, nonvolatile "1" is stored by applying $V_{cc}$ to the bit line and turning on the transistor. The recall operation is performed by precharging the bit line to a potential below $V_{cc}/2$ and then raising the word-line potential to turn on the transistor as shown in FIG. 8. Once the change in bit line potential is sensed, the corresponding volatile state is written into the cell. Note that, in this embodiment, the drive line is always fixed at $V_{cc}/2$ regardless of the mode of operation (volatile read and write or nonvolatile store and recall).

The nonvolatile data storage and recovery operations, are performed rapidly because all the memory cells connected to a common word line are stored or recovered simultaneously. The memory cell array can be organized into blocks or sectors, within each block or sector all the data is stored either as nonvolatile data waiting to be recovered or as volatile data requiring periodic refreshing.

Figure 9:
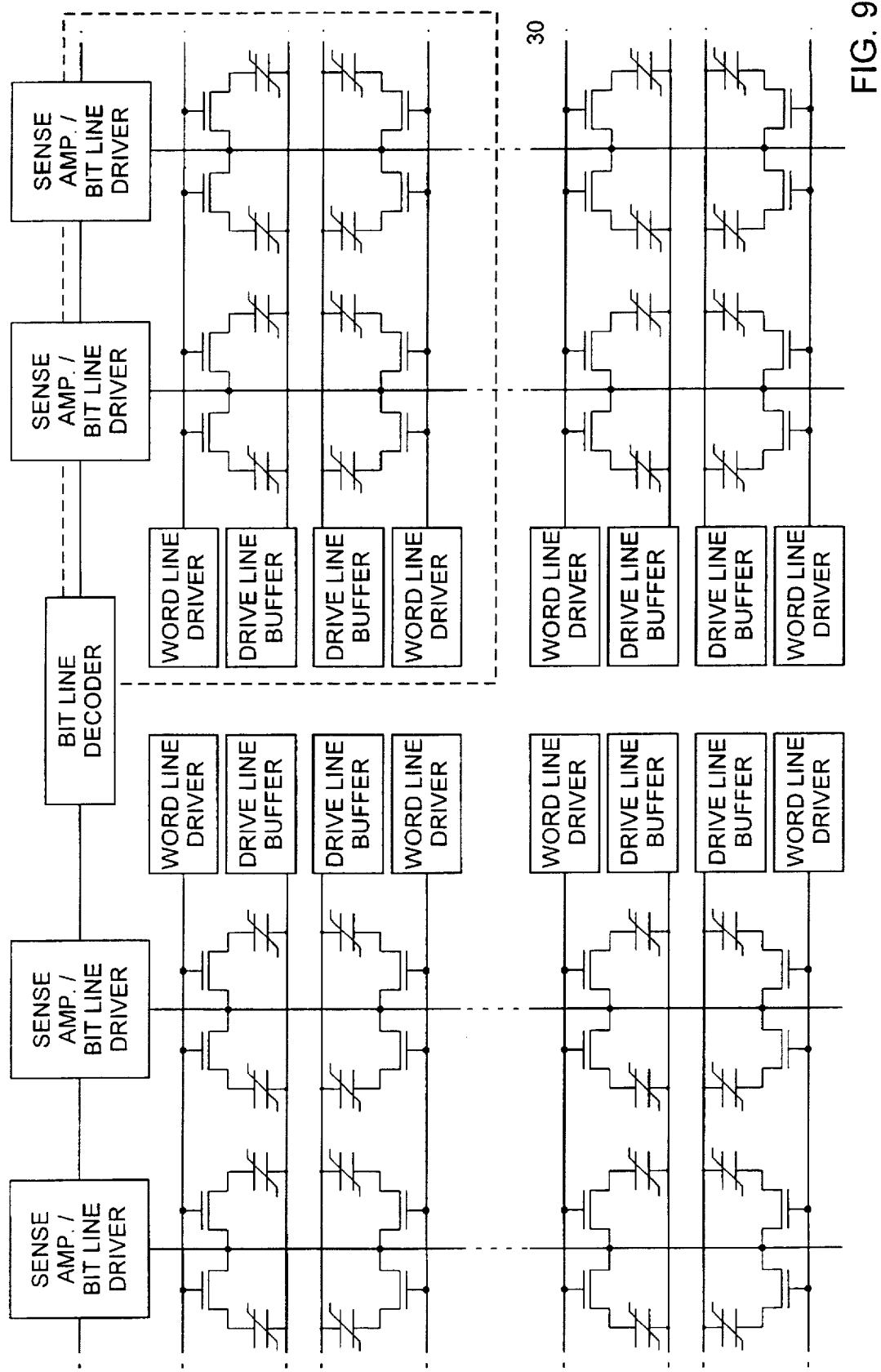
FIG. 9 is a block diagram of an array of memory cells according to another embodiment of this invention.

A memory circuit may consist of many millions of the memory cells described above arranged in an array. FIG. 9 shows such a two-dimensional array. Not all of the cells in the array need to participate in a store or recall operation at a give time. The contents in a portion of the array can be selectively stored or recalled. The array architecture shown in FIG. 9 conveniently allows selective store or recall operation. For example, the portion of the array inside the box 30, referred to as a sector or block, may be chosen to undergo a store operation row by row. In other words, the data in the first row may be read and stored in the nonvolatile mode by setting the bit lines to the appropriate potential and raising the word-line potential on the first row (see FIG. 4). This completes the store operation for the first row of cells. This operation is then repeated for the other rows in the sector while the rest of the array is unaffected by the store operation. Similarly, a recall operation may be performed in selected sectors only.

Furthermore, some sectors may be designated as read-only, that is, sectors into which no new data may be written. These sectors may be defined by the contents of a special nonvolatile memory register using circuits similar to the redundancy circuit used to enhance the yield of memory ICs or to make field-programmable gate arrays such as those described in *IEEE International Solid-State Circuits Conference Digest of Technical Papers* (1981, pp. 80–81) and in *IEEE Spectrum* (December 1988, pp. 32–35). The contents of this memory register can be set by the user.

Figure 10:
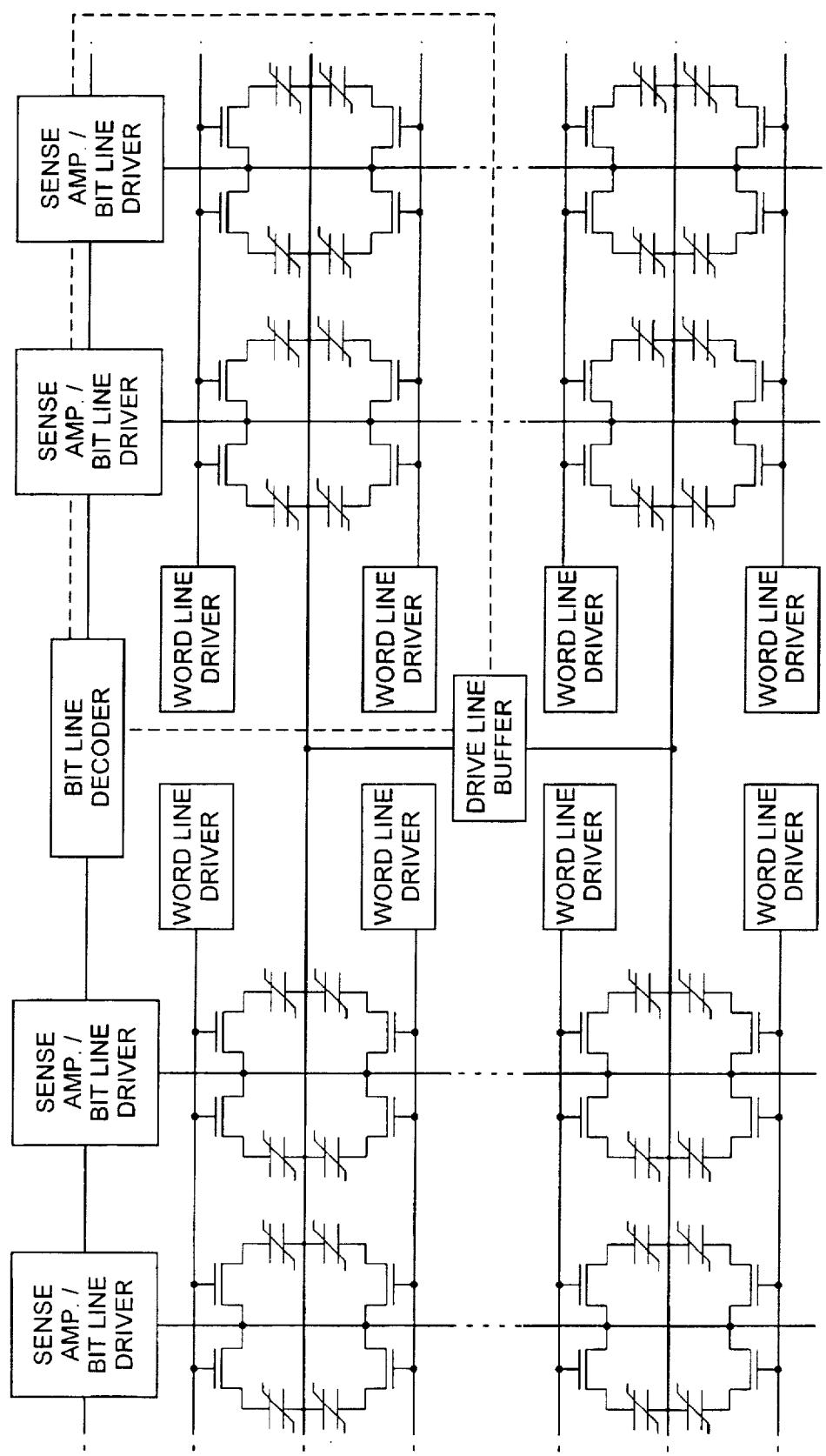
FIG. 10 is a block diagram of an array of memory cells where all rows share the same drive line.

Each pair of rows in FIG. 9 can share a common drive line and drive-line buffer. In fact, any number of rows, including all of the rows in a sector or block, may share a common drive line and drive-line buffer. FIG. 10 illustrates the extreme case where all rows in an entire memory array share the same drive line and drive-line buffer. By varying the number of rows sharing a common drive line and drive-line buffer, one may eliminate contact holes to individual drive lines and reduce the cell and circuit size. Whether or not drive lines and drive-line buffers are shared, blocks or sectors of cells may be selectively stored or recalled or designated as read-only as described above.

The nonvolatile ferroelectric memory described here has numerous applications. It can replace the magnetic storage medium (as "semiconductor disks"), the nonvolatile memory (ROM, EPROM, or EEPROM), or the operating memory (volatile RAM) in computers or controllers. The same nonvolatile ferroelectric memory can function both as the operating memory and the nonvolatile storage medium or the magnetic disk, with large savings in power consumption, volume, weight, cost and maintenance. When the system power is off, the nonvolatile ferroelectric memory stores the data permanently just as magnetic disks do. The ferroelectric memory can also be packaged in card form as removable storage medium. When the system power is on, upon command, the nonvolatile data stored in the ferroelectric memory device, or a sector thereof, is recovered and the device, or the sector thereof, begins to function as operating memory (ordinary DRAM) until it receives the next command to freeze the data into nonvolatile storage. Since the frequency for storing and recovering nonvolatile data is relatively low, the fatigue limit of $10^{12}$ storage/recovery cycles (2.5 billion cycles per day for 10 years) is more than sufficient. By including well known circuitry, the memory device or the computer system employing it can detect imminent power failures tens of milliseconds before the loss of power and automatically issue a command to freeze the memory content into nonvolatile storage. The circuitry and procedures for detecting imminent power failures are well known and currently used in nonvolatile RAMs (also known as N0VRAM, NVRAM, or shadow N0VRAM and produced by companies such as Xicor and Exel).

In summary, this invention teaches a nonvolatile ferroelectric DRAM that can alternately function as an ordinary DRAM and as a nonvolatile memory with unlimited and fast read/write cycles, very high nonvolatile store/recovery cycles, and packed in a memory cell that can be smaller than that of an ordinary DRAM cell.

Figure 11:
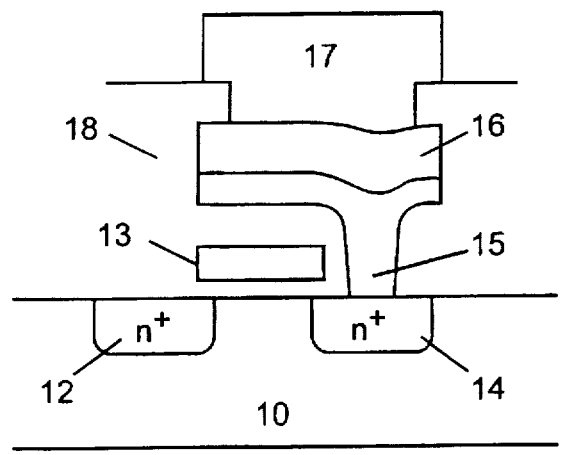
FIG. 11 is a cross-sectional view of one embodiment of the memory cell.

FIG. 11 is a cross-sectional view of a preferred embodiment of a nonvolatile ferroelectric DRAM cell. As shown, a p-conductivity type silicon wafer 10 is doped with n-conductivity type impurity to form a source/drain 12 of the transistor which is connected (not shown) to the bit line in FIG. 3. The gate 13 of the transistor is coupled to, and often integrally formed with the word line. Another n-type silicon region 14 serves as the other source/drain terminal of the transistor. The entire structure is covered with one or more dielectric layers 18. A contact hole extends through the dielectrics to enable electrical connections to region 14. A metal connection 15, or other conducting materials such as a metal nitride or a metal silicide, provides an electrical connection to region 14. The connection also serves as one of the capacitor electrodes, while separating the ferroelectric film 16 from the reactive silicon to prevent chemical reaction or diffusion, if necessary. Film 16 is a ferroelectric material, preferably of a few hundred to a few thousand Angstroms in thickness. The other capacitor electrode 17 is switchably connected to $V_{cc}$ as shown in FIG. 3 or connected in the manner shown in other figures. The ferroelectric material 6 is surrounded by electrodes 15 and 17, and dielectrics 18. The dielectrics 18 and electrodes 15, 17 in contact with ferroelectric 16 are preferably chosen so as not to react with, nor degrade the ferroelectric and dielectric properties of layer 16.

The memory cell and array described above can be fabricated using well known integrated circuit fabrication technology. For example, the gate, source and drain can be manufactured using the well known self-aligned polycrystalline silicon gate process in which the gate electrode is defined and used as a mask for implanting the source and drain. After depositing suitable dielectric material over the surface of the structure, contact openings are etched, or otherwise formed, to expose the sources, drains and gates as desired. Then suitable metal, metal nitride, polysilicon or metal silicide contacts can be formed to the source, drain and gate (if desired), thereby creating a lower plate for the storage capacitor. Next, the ferroelectric layer is deposited by sputtering, chemical vapor deposition (CVD), including plasma enhanced CVD and metallo-organic CVD, from a solution (Sol Gel technique), or using other techniques, and then annealed. For a description of the Sol Gel technique, see "Preparation of $Pb(Zr,Ti)O_3$ Thin Films by Sol Gel Processing: Electrical, Optical, and Electro-optic Properties," by G. Yi, Z. Wu, and M. Sayer, *Journal of Applied Physics* (1 Sep. 1988) 64(5):2717. In the preferred embodiment, the ferroelectric film consists of a material which can be "permanently" polarized by application of a suitable electric field. Examples of such materials include lead zirconate titanate, barium titanate, barium magnesium fluoride and lithium niobate. Then the other plate of the capacitor is deposited, again using well known materials and techniques. Additional well known processing, for example, formation of a passivation coating can then be carried out. In one experiment described in "A Ferroelectric DRAM Cell for High Density NVRAMs," by Reza Moazzami, et al., *IEEE* 1990 *Symposium on VLSI Technology* (April, 1990), pp. 15–16, the ferroelectric consisted of $PbZr_{0.5}Ti_{0.5}O_3$, and the electrodes were platinum.

Figure 12:
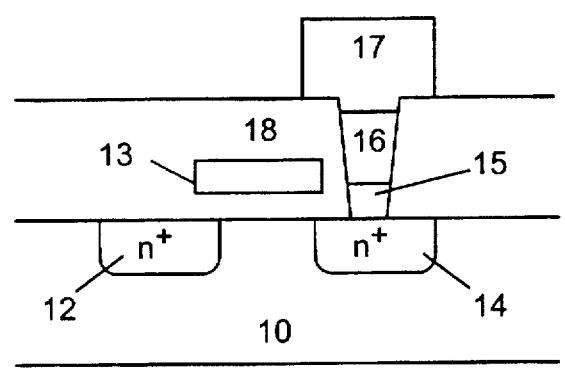
FIG. 12 is a cross-sectional view of another embodiment of the memory cell.

FIG. 12 is a cross-sectional view of an alternate embodiment of the memory cell of this invention. Reference numerals corresponding to those used in FIG. 11 have been used for corresponding components. The cell of FIG. 12, however, employs a smaller capacitor compared to the cell size than does the cell of FIG. 11.

We claim:

1. A method of operating a memory cell having a transistor connected to a bit line, a word line, a drive line, and only one storage capacitor, the storage capacitor having a ferroelectric dielectric, the method comprising:

operating the memory cell in a volatile mode of operation to write information into the memory cell by applying and maintaining a positive potential to the drive line;

switching the memory cell to a non-volatile mode of operation to store information in the memory cell upon receiving a store command;

storing a first ferroelectric polarization state in the storage capacitor, the first ferroelectric polarization state defined by grounding the bit line and maintaining the positive potential to the drive line to establish an electric field in a first direction across the ferroelectric dielectric;

storing a second ferroelectric polarization state in the storage capacitor, the second ferroelectric polarization state defined by grounding the drive line and applying the positive potential to the bit line to establish and electric field in a second direction across the ferroelectric dielectric, the second direction opposite the first direction; and operating the memory cell in the volatile mode of operation to recall information from the memory cell, including the first ferroelectric polarization state, by applying and maintaining the positive potential to the drive line.

2. A method as in claim 1 wherein:

when operating in the non-volatile mode of operation, the positive potential is coupled to the drive line of the memory cell to automatically store the first ferroelectric polarization state in the storage capacitor, unless the positive potential is coupled to the bit line and the drive line is grounded to automatically store the second ferroelectric polarization state in the storage capacitor.

3. A method as in claim 1 further comprising the step of:

upon receiving a recall command, applying and maintaining the positive potential to the drive line and precharging the bit line to a potential lower than the positive potential and recognizing a small potential rise on the bit line as the first ferroelectric polarization state and recognizing a large potential rise on the bit line as the second ferroelectric polarization state.

4. A method as in claim 3 wherein the step of switching the memory cell to the non-volatile mode of operation comprises grounding the drive line.

5. A method of storing data in a two-dimensional array of ferroelectric cells, the method comprising:

selecting a first portion of the two-dimensional array to operate in a first mode of data operation, the first mode of data operation being either a first mode of volatile data storage or a second mode of volatile data recall; and designating a second portion of the two-dimensional array to operate in a second mode of data operation, the second mode of data operation being either a third mode of nonvolatile data read or a fourth mode of nonvolatile data write.

6. A method of operating a memory cell having a transistor connected to a bit line, a word line, and a drive line and only one storage capacitor, the storage capacitor having a ferroelectric dielectric, a polarization state and a charge state, the method comprising the steps of:

applying a first potential to the drive line;

applying a second potential to the bit line while maintaining the drive line voltage at the first potential so as to polarize the one storage capacitor in a first polarization state;

applying a third potential to the bit line while maintaining the drive line voltage at the first potential so as to polarize the one storage capacitor in a second polarization state, the second polarization state opposite that of the first polarization state;

sensing the polarization state of the one storage capacitor while maintaining the drive line voltage at the first potential;

applying the first potential to the bit line while maintaining the drive line voltage at the first potential so as to store a first charge state in the one storage capacitor;

applying the second potential to the bit line while maintaining the drive line voltage at the first potential so as to store a second charge state in the one storage capacitor; and sensing the charge state of the one storage capacitor while maintaining the drive line voltage at the first potential.

7. A method of operating a memory cell having a transistor connected to a bit line, a word line, and a drive line and only one storage capacitor, the storage capacitor having a ferroelectric dielectric, a polarization state and a charge state, the method comprising:

applying a first potential to the drive line;

applying the first potential to the bit line while maintaining the drive line at the first potential so as to polarize the one storage capacitor in a first polarization state;

applying a second potential to the bit line while maintaining the drive line at the first potential so as to polarize the one storage capacitor in a second polarization state, the second polarization state opposite that of the first polarization state;

applying the second potential to the drive line; and sensing the polarization state of the one storage capacitor while maintaining the drive line at the second potential.

8. The method of claim 7, further comprising the steps of:

applying the first potential to the bit line while maintaining the drive line at the second potential so as to store a first charge state in the one storage capacitor;

applying the second potential to the bit line while maintaining the drive line at the second potential so as to store a second charge state in the one storage capacitor; and sensing the charge state of the one storage capacitor while maintaining the drive line voltage at the second potential.

9. The method of claim 6 further comprising the step of:

operating the memory cell in the volatile mode of operation to recall information from the memory cell, including the second ferroelectric polarization state, by applying and maintaining the positive potential to the drive line.

10. The method of claim 6 wherein the step of sensing the polarization state of the one storage capacitor comprises:

applying and maintaining the first potential to the drive line and precharging the bit line to a fourth potential, the fourth potential being less than the first potential.

11. The method of claim 10 wherein the step of sensing the polarization state of the one storage capacitor further comprises:

recognizing a small potential rise on the bit line as the first ferroelectric polarization state and recognizing a large potential rise on the bit line as the second ferroelectric polarization state.

12. The method of claim 6 wherein the second potential is at ground.

13. The method of claim 6 wherein the first potential is greater than the third potential.

14. A method of operating a memory cell having a transistor connected to a bit line, a word line, a drive line, and only one storage capacitor, the storage capacitor having a ferroelectric dielectric, the method comprising:

operating the memory cell in a volatile mode of operation to write information into the memory cell by grounding the drive line;

switching the memory cell to a non-volatile mode of operation to store information in the memory cell upon receiving a store command;

storing a first ferroelectric polarization state in the storage capacitor, the first ferroelectric polarization state defined by applying the bit line at a positive potential and grounding the drive line to establish an electric field in a first direction across the ferroelectric dielectric;

storing a second ferroelectric polarization state in the storage capacitor, the second ferroelectric polarization state defined by grounding the bit line and applying the positive potential to the drive line to establish and electric field in a second direction across the ferroelectric dielectric, the second direction opposite the first direction; and operating the memory cell in the volatile mode of operation to recall information from the memory cell, including the first ferroelectric polarization state, by grounding the drive line.

15. The method of claim 14 further comprising the step of:

upon receiving a recall command, grounding the drive line and precharging the bit line to a potential higher than ground, and recognizing a small potential rise on the bit line as the first ferroelectric polarization state and recognizing a large potential rise on the bit line as the second ferroelectric polarization state.

16. The method of claim 14 wherein the step of switching the memory cell to the non-volatile mode of operation comprises applying the positive potential to the drive line.

17. The method of claim 14 further comprising the step of:

operating the memory cell in the volatile mode of operation to recall information from the memory cell, including the second ferroelectric polarization state, by grounding the drive line.

18. The method of claim 14 further comprising the step of:

detecting an imminent power failure and issuing the store command.

19. The method of claim 5 wherein the two-dimensional array comprises a first plurality of memory cells, each of the plurality of memory cells having a transistor connected to a bit line, a word line, a drive line, and only one storage capacitor, the storage capacitor having a ferroelectric dielectric, the first portion of the two-dimensional array comprising a second plurality of memory cells, and the second portion of the two-dimensional array comprising a third plurality of memory cells.

20. The method of claim 19 wherein the second plurality of memory cells include a first memory cell and a second memory cell, the method further comprising the step of:

coupling a drive line of the first memory cell and a drive line of the second memory cell to a drive line buffer.

21. The method of claim 20 further comprising the step of:

coupling the drive line buffer to a positive potential.

* * * * *